(12) United States Patent
Yang

(10) Patent No.: US 9,379,344 B2
(45) Date of Patent: Jun. 28, 2016

(54) DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Ming Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/415,935

(22) PCT Filed: Apr. 29, 2014

(86) PCT No.: PCT/CN2014/076434
§ 371 (c)(1),
(2) Date: Jan. 20, 2015

(87) PCT Pub. No.: WO2015/096336
PCT Pub. Date: Jul. 2, 2015

(65) Prior Publication Data
US 2016/0028035 A1 Jan. 28, 2016

(30) Foreign Application Priority Data
Dec. 27, 2013 (CN) .......................... 2013 1 0739893

(51) Int. Cl.
*H01L 33/00* (2010.01)
*H01L 51/50* (2006.01)
(Continued)

(52) U.S. Cl.
CPC ............. *H01L 51/5036* (2013.01); *B82Y 15/00* (2013.01); *H01L 27/322* (2013.01);
(Continued)

(58) Field of Classification Search
CPC ...... B82Y 15/00; H01L 51/502; H01L 33/06; H01L 51/5072; H01L 2924/12044
See application file for complete search history.

(56) References Cited

U.S. PATENT DOCUMENTS

| | | | |
|---|---|---|---|
| 8,101,941 B2* | 1/2012 | Choulis | B82Y 20/00 257/40 |
| 8,884,511 B2* | 11/2014 | Gibson | B82Y 20/00 313/503 |

(Continued)

FOREIGN PATENT DOCUMENTS

| | | |
|---|---|---|
| CN | 102576746 A | 7/2012 |
| CN | 103227189 A | 7/2013 |

(Continued)

OTHER PUBLICATIONS

1st Office Action issued in Chinese application No. 201310739893.7 issued Jul. 27, 2015.
(Continued)

*Primary Examiner* — Ngan Ngo
(74) *Attorney, Agent, or Firm* — Nath, Goldberg & Meyer; Joshua B. Goldberg; Stanley N. Protigal

(57) ABSTRACT

The invention belongs to the field of display technology, and particularly to a display panel and a display device. The display panel includes a driving substrate and an OLED provided on the driving substrate, the OLED includes a first electrode and a second electrode, and further includes an electron transporting layer, a light-emitting layer and a hole transporting layer provided between the first electrode and the second electrode, and a plurality of color conversion units are uniformly distributed in the electron transporting layer, the light-emitting layer or the hole transporting layer. Advantageous effects of the invention are as follows: with the configuration that the color conversion units are directly doped into any one of the hole transporting layer, the light-emitting layer, and the electron transporting layer, structure of display panel and corresponding manufacturing procedure are simplified, and color purity of the display panel and carrier mobility are efficiently increased.

26 Claims, 2 Drawing Sheets

(51) Int. Cl.
*B82Y 15/00* (2011.01)
*H01L 33/06* (2010.01)
*H01L 27/32* (2006.01)

(52) U.S. Cl.
CPC ............ *H01L27/3211* (2013.01); *H01L 33/06* (2013.01); *H01L 51/502* (2013.01); *H01L 51/5056* (2013.01); *H01L 51/5072* (2013.01); *H01L 51/5092* (2013.01); *H01L 2251/5369* (2013.01)

(56) References Cited

U.S. PATENT DOCUMENTS

| | | | | |
|---|---|---|---|---|
| 2008/0048571 | A1* | 2/2008 | Yoon | B82Y 20/00 315/169.3 |
| 2008/0218068 | A1* | 9/2008 | Cok | H05B 33/145 313/505 |
| 2008/0237611 | A1* | 10/2008 | Cok | B82Y 20/00 257/79 |
| 2009/0278141 | A1* | 11/2009 | Coe-Sullivan | B82Y 20/00 257/89 |
| 2009/0280586 | A1* | 11/2009 | Coe-Sullivan | B82Y 10/00 438/22 |
| 2009/0286338 | A1* | 11/2009 | Coe-Sullivan | B82Y 30/00 438/29 |
| 2010/0051901 | A1* | 3/2010 | Kazlas | B82Y 20/00 257/13 |
| 2010/0102294 | A1* | 4/2010 | Jou | H05B 33/20 257/13 |
| 2010/0108984 | A1* | 5/2010 | Cho | C09K 11/025 257/13 |
| 2010/0213438 | A1* | 8/2010 | Cho | B82Y 20/00 257/13 |
| 2010/0224859 | A1* | 9/2010 | Gough | B82Y 20/00 257/13 |
| 2010/0237322 | A1* | 9/2010 | Okada | H01L 51/5012 257/13 |
| 2010/0244062 | A1* | 9/2010 | Ueno | B82Y 20/00 257/90 |
| 2011/0284819 | A1* | 11/2011 | Kang | B82Y 20/00 257/9 |
| 2014/0027712 | A1* | 1/2014 | Breen | H01L 51/502 257/13 |
| 2014/0054541 | A1* | 2/2014 | Chung | B82Y 20/00 257/13 |
| 2014/0374697 | A1* | 12/2014 | Liu | H01L 51/502 257/13 |
| 2015/0021544 | A1* | 1/2015 | Huang | H01L 33/02 257/13 |
| 2015/0085223 | A1* | 3/2015 | Park | G02F 1/133615 349/65 |
| 2015/0102291 | A1* | 4/2015 | Park | H01L 27/3216 257/40 |
| 2015/0194467 | A1* | 7/2015 | Zhang | H01L 27/156 257/13 |
| 2015/0228697 | A1* | 8/2015 | Liu | H01L 27/32 257/40 |
| 2015/0287927 | A1* | 10/2015 | Okubo | B82Y 20/00 257/40 |

FOREIGN PATENT DOCUMENTS

| | | |
|---|---|---|
| CN | 103346266 A | 10/2013 |
| CN | 103346866 A | 10/2013 |
| CN | 103427049 A | 12/2013 |
| CN | 103730584 A | 4/2014 |
| CN | 203983339 U | 12/2014 |
| WO | 2013/019030 A1 | 2/2013 |
| WO | 2013/157494 A1 | 10/2013 |

OTHER PUBLICATIONS

Form PCT/ISA/237 issued in International application No. PCT/CN2014/076434 mailed Sep. 24, 2014.
International Search Report in International Application No. PCT/CN2014/076434.

* cited by examiner

DISPLAY PANEL AND DISPLAY DEVICE

This is a National Phase Application filed under 35 U.S.C. 371 as a national stage of PCT/CN2014/076434, filed Apr. 29, 2014, an application claiming the benefit of Chinese Application No. 201310739893.7, filed Dec. 27, 2013, the content of each of which is hereby incorporated by reference in its entirety.

FIELD OF THE INVENTION

The present invention relates to the field of display technology, in particular to a display panel and a display device.

BACKGROUND OF THE INVENTION

Organic Light-Emitting diode (OLED) has been frequently used in the flat panel display device more and more recently due to its thinness contour and lightness, wide viewing angle, high response speed, high contrast and other advantages.

With the development of display technology, currently there occurs a method for an OLED display device to realize a full-color display by combining a color conversion material with blue light emission. The OLED at least includes an anode, a light-emitting layer and a cathode, and the light-emitting layer is generally made of an organic material. A feasible method for realizing the full-color display by combining the color conversion and the blue light emission is to use an inorganic doped material, such as Ce doped yttrium aluminum garnet, Eu doped alkaline earth metal silicate, or rare earth doped silicon nitride or oxynitride, which can be stimulated by the blue light. However, these color conversion materials usually have problems of low color purity and low efficiency.

With the development of material technology, currently some people have proposed the use of quantum dots (a nanostructure) as a color conversion material. Quantum dots are generally light-emitting particles of nanometer sizes, and emit visible fluorescence after being stimulated by absorbing certain energy. The quantum dots can be precisely controlled to emit light of different wavelengths simply by replacing chemical composition of the quantum dots or adjusting the sizes of the quantum dots, so as to get the visible light of different colors; compared to the traditional color conversion material, both intensity and stability of fluorescence emitted from the quantum dots are good, furthermore, the quantum dots have high luminous efficiency, narrow half peak width of the luminous spectrum, and high color purity, therefore, the quantum dots are an excellent color conversion material.

FIG. 1 shows a schematic view of a structure of an organic light-emitting diode: the organic light-emitting diode 20 includes a first electrode 21, a second electrode 25, and an electron transporting layer 22, a light-emitting layer 23 (blue OLED or ultraviolet OLED) and a hole transporting layer 24 provided between the first electrode 21 and the second electrode 25; a quantum dot layer 26 is provided outside the organic light-emitting diode 20, namely the quantum dot layer 26 is provided above the second electrode 25. There are a plurality of quantum dot units 280 uniformly distributed inside the quantum dot layer 26; red light quantum dots and green light quantum dots correspond to red sub-pixel units and green sub-pixel units, respectively; a color filter 27 is used for filtering out blue light or ultraviolet light emitted from the quantum dot layer 26, improving the color purity.

It can be found that, when manufacturing the OLED shown in FIG. 1, two additional (for blue OLED) or three additional (for ultraviolet OLED) masks are required for the quantum dot layer 26; on the one hand, the cost is increased, and on the other hand, the manufacturing procedure is complex.

SUMMARY OF THE INVENTION

A technical problem to be solved by the invention aims at the shortages existing in the prior art, to provide a display panel and a display device, and the display panel has a simple structure, the manufacturing procedure thereof can be simplified, the color purity thereof can be effectively improved, and the carrier mobility can be effectively increased.

The technical solution employed to solve the above technical problem is a display panel, including a driving substrate and an organic light-emitting diode provided on the driving substrate, wherein the organic light-emitting diode includes a first electrode and a second electrode, and further includes an electron transporting layer, a light-emitting layer and a hole transporting layer provided between the first electrode and the second electrode, and wherein a plurality of color conversion units are uniformly distributed in any one of the electron transporting layer, the light-emitting layer and the hole transporting layer.

Preferably, the color conversion unit includes a core and a shell encasing the core, the core includes a quantum dot and the shell includes a layered structure made of an organic material, or a laminated structure made of an organic material and an inorganic material.

Preferably, the quantum dot includes group II-VI CdS, CdSe, CdTe, ZnO, ZnS, ZnSe, ZnTe, HgS, HgSe, HgTe, and group III-V GaAs, GaP, GaSb, InAs, InP, InSb, AlAs, AlP or AlSb; and the organic material includes mercaptoethanol, and the inorganic material includes CdS or ZnS.

Preferably, the quantum dot includes a red quantum dot, a green quantum dot or a blue quantum dot, the red quantum dot as the core has a particle size in the range of 5.0 to 5.5 nm, the green quantum dot as the core has a particle size in the range of 3.0 to 3.5 nm, and the blue quantum dot as the core has a particle size in the range of 2.0 to 2.5 nm.

Preferably, the electron transporting layer is made of any one of the following materials, of which the electron transporting capability prevails over the hole transporting capability: metal complexes, carbazole derivatives, imidazole derivatives, o-phenanthroline derivatives or anthracene derivatives; the light-emitting layer is made of a matrix material doped with a luminous material; and the hole transporting layer is made of any one of the following materials, of which the hole transporting capability prevails over the electron transporting capability: aromatic diamine compounds, triphenylamine compound, aromatic triamine compounds, biphenyl diamine derivatives, triarylamine polymers.

Preferably, the matrix material of the light-emitting layer is any one of the following materials, which has the electron transporting capability: metal complexes, carbazole derivatives, imidazole derivatives, o-phenanthroline derivatives or anthracene derivatives, or is any one of the following materials, which has the hole transporting capability: aromatic diamine compounds, triphenylamine compound, aromatic triamine compounds, biphenyl diamine derivatives, triarylamine polymers; and the luminous material is Alq (8-hydroxyquinoline aluminum), BAlq (bis(2-methyl-8-hydroxyquinoline-N1, 08 (1,1'-biphenyl-4-hydroxyl)aluminum), or DPVBi (4,4'-Bis(2,2-diphenylvinyl)-1,1'-biphenyl), or PPV (Poly(p-phenylene vinylene)) or its derivatives.

Preferably, the driving substrate is divided into a plurality of sub-pixel regions, each sub-pixel region is provided with the organic light-emitting diode therein, the sub-pixel region is further provided with an electronic control element therein, which is electrically connected to the first electrode or the second electrode of the organic light-emitting diode, and is used for controlling whether the organic light-emitting diode emits light or not.

Preferably, the driving substrate is divided into a plurality of sub-pixel regions, the sub-pixel region is further provided with a color filter, the color filter is arranged at a light outgoing side of the organic light-emitting diode, and the color filter causes the light emitted from the organic light-emitting diode to be selectively transmitted through the display panel.

Preferably, the electron transporting layer, the light-emitting layer and the hole transporting layer of the organic light-emitting diode are formed by evaporation, spin coating or ink jet printing. Preferably, the color filter includes a red color filter, a green color filter or a blue color filter, and light emitted from the light-emitting layer of the organic light-emitting diode or light converted by the color conversion unit is transmitted through the display panel via one of the red color filter, the green color filter and the blue color filter, which is matched with the light in color.

The invention further provides a display device, including the display panel mentioned above.

Advantageous effects of the invention are as follows: in the display panel of the invention, with the configuration that the color conversion units are directly doped into any one of the hole transporting layer, the light-emitting layer, and the electron transporting layer, the structure of the display panel and corresponding manufacturing procedure are simplified, and the color purity of the display panel and carrier mobility are efficiently increased.

Figure 1:
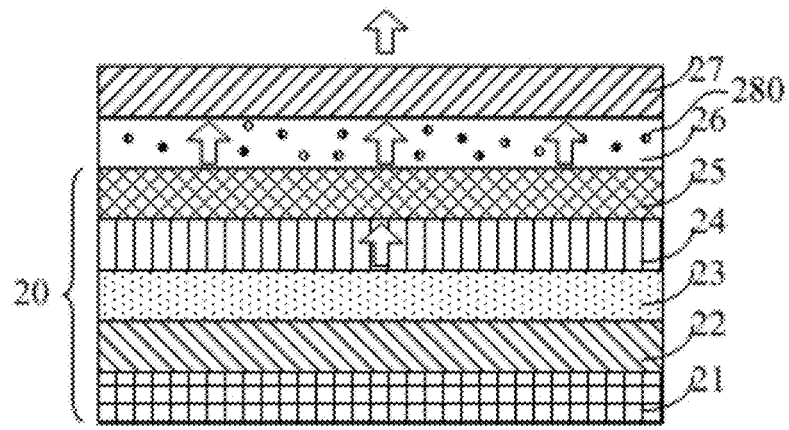
FIG. 1 is a schematic view of a structure of an organic light-emitting diode in the prior art.

In the drawings:
10: driving substrate; 11: electronic control element;
20, 201, 202, 203: organic light-emitting diode; 21: first electrode;
22, 22': electron transporting layer; 23, 23': light-emitting layer;
24, 24': hole transporting layer; 25: second electrode; 26: quantum dot layer;
27: color filter; 28: color conversion unit; 280: quantum dot; 21: inorganic material layer; 282: organic material layer.

In addition, it should be pointed out that, the respective figures are just illustrative, and are not drawn to scale.

DETAILED DESCRIPTION OF THE EMBODIMENTS

In order to make persons skilled in the art better understand technical solutions of the invention, the display panel and the display device of the invention will be further described in detail below in conjunction with the drawings and the particular implementations.

One technical solution of the invention provides a display panel, including a driving substrate and an organic light-emitting diode provided on the driving substrate, wherein the organic light-emitting diode includes a first electrode and a second electrode, and further includes an electron transporting layer, a light-emitting layer and a hole transporting layer provided between the first electrode and the second electrode, and wherein a plurality of color conversion units are uniformly distributed in the electron transporting layer, the light-emitting layer or the hole transporting layer. Preferably, the light-emitting layer emits blue light, and in order to ensure that each sub-pixel emits red light and green light, each sub-pixel is generally provided with both red quantum dots and green quantum dots; at the same time, in order to ensure that all sub-pixels emit the same red light and the same green light, the plurality of color conversion units are preferably uniformly distributed in any one of the electron transporting layer, the light-emitting layer and the hole transporting layer.

Another technical solution of the invention provides a display device, which includes the above display panel.

Embodiment 1

Figure 2A:
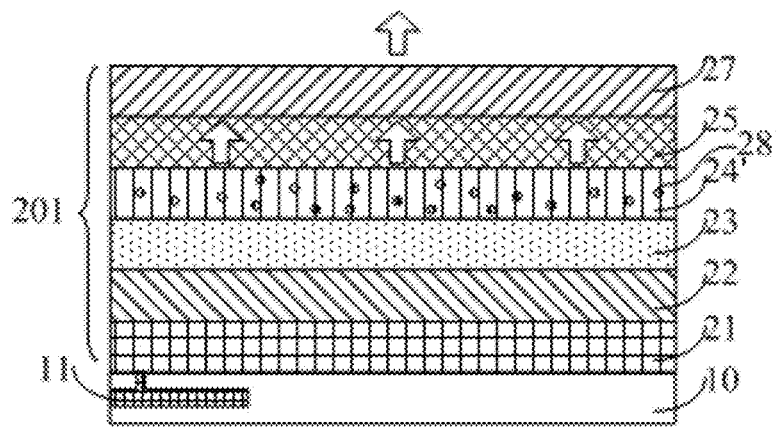
FIG. 2A is a schematic view of a structure of a display panel according to Embodiment 1 of the invention.

The present embodiment provides a display panel, as shown in FIG. 2A, and the display panel includes a driving substrate 10 and an organic light-emitting diode 201 provided on the driving substrate 10, the organic light-emitting diode 201 includes a first electrode 21 and a second electrode 25, and further includes an electron transporting layer 22, a light-emitting layer 23 and a hole transporting layer 24' provided between the first electrode 21 and the second electrode 25. In the present embodiment, a plurality of color conversion units 28 are uniformly distributed in the hole transporting layer 24'.

In the present embodiment, the driving substrate 10 may be divided into a plurality of sub-pixel regions (each sub-pixel region corresponds to one sub-pixel unit), each sub-pixel region is provided with an organic light-emitting diode 201 therein, and the sub-pixel region is further provided with an electronic control element 11, which is electrically connected to the first electrode 21 or the second electrode 25 of the organic light-emitting diode 201, and is used for controlling whether the organic light-emitting diode 201 emits light or not.

Typically, the electronic control element 11 is a thin film transistor (TFT), and in this embodiment, the TFT for driving the organic light-emitting diode 201 may be an a-Si TFT, an oxide TFT, a LTPS-TFT (low temperature polysilicon) or an HTPS-TFT (high temperature polysilicon). The organic light-emitting diode 201 may be driven in a passive matrix (Passive Matrix Organic Light Emission Display, which is referred to as PMOLED for short) drive mode or in an active matrix (Active Matrix Organic Light Emission Display, which is referred to as AMOLED for short) drive mode.

In the present embodiment, the color conversion unit 28 includes a core and a shell encasing the core, namely the color conversion unit 28 is of a core/shell structure. The core includes a quantum dot 280, and the shell includes an organic material layer 282 made of an organic material, or a laminated structure of an organic material layer 282 and an inorganic material layer 282 made of an organic material and an inorganic material, respectively. Under normal circumstances, the doped particles (i.e. the color conversion units 28 without being modified) are directly introduced into the intrinsic material (i.e. the matrix material for forming the hole transporting layer 24'), the carrier recombination may occur at the interface between the doped particles and the intrinsic material, which will lead to a degradation in certain characteristics of the intrinsic material; in the present embodiment, in order to ensure that the carriers are transported smoothly, the surfaces of doped particles are modified, to form the core/shell structure. Preferably, the thickness of the shell is at the nanometer level, that is, less than 1 micron.

The quantum dots are usually light-emitting particles of nanometer sizes, and emit visible fluorescence after being stimulated by absorbing certain energy. Luminous spectrum can be controlled by changing the sizes of the quantum dots, and the intensity and the stability of the fluorescence are good, the efficiency is high, the half peak width of the luminous spectrum is narrow, and the quantum dots can be precisely controlled to emit light of different wavelengths simply by replacing chemical composition of the quantum dots or adjusting the sizes of the quantum dots, so as to get the visible light of different colors, and thus are a good color conversion material. Many kinds of quantum dots exist, and preferably, in the present embodiment, the quantum dots include group II-VI CdS, CdSe, CdTe, ZnO, ZnS, ZnSe, ZnTe, HgS, HgSe, HgTe, and group III-V GaAs, GaP, GaSb, InAs, InP, InSb, AlAs, AlP and AlSb etc. For modifying the surface of the shell, the organic material may be mercaptoethanol, and the inorganic material may be CdS or ZnS.

When applied to the field of display technology, the quantum dots can include red, green and blue quantum dots, the red quantum dot as the core has the particle size in the range 5.0-5.5 nm, the green quantum dot as the core has the particle size in the range 3.0-3.5 nm, and the blue quantum dot as the core has the particle size in the range 2.0-2.5 nm. Taking ZnS as an example, the red quantum dot emitting red light has a particle size of 5 nm, and the green quantum dot emitting green light has a particle size of 3 nm. The advantages using color conversion units 28 are in that, even with the same kind of quantum dots, the sizes of the quantum dots in the color conversion units 28 can be adjusted to achieve precise control of emission wavelength, to get visible light of different colors. In the present embodiment, the display panel may use three primary colors, R (red), G (green), B (blue), and therefore, it is only required to provide the color conversion units with red quantum points as the cores, and the color conversion units with green quantum points as the cores, in the organic light-emitting diode.

Of course, according to the different display applications, the quantum dots as the cores may also include yellow quantum dots, orange yellow or cyan quantum dots. In a practical application, according to the luminous characteristics of the quantum dots, for example: the half peak width of the luminous spectrum, luminous peak and luminous wavelength etc., light of different colors can be obtained by adjusting ratio of quantum dots of different materials, or quantum dots of different sizes. In general, the narrower the half peak width of the luminous spectrum of the quantum dot is, the higher the color purity is, and the better the color display effect is; the amplitude of the emitted light may be changed by adjusting the distribution ratio of the color conversion units.

The matrix material of the hole transporting layer 24' is generally an organic material, and aromatic amine fluorescent compound is commonly used. In the present embodiment, the matrix material of the hole transporting layer 24' uses one of the following compounds of which the hole-transporting capabilities are higher than the electron-transporting capabilities: aromatic diamine compounds, triphenylamine compound, aromatic triamine compounds, biphenyl diamine derivatives, triarylamine polymers, for example: NPB(N,N'-bis(1-naphthyl)-N,N'-diphenylbenzidine), TPD(N,N'-bis(3-methylphenyl)-N,N'-diphenylbenzidine), TCTA(4,4',4"-Tris (carbazol-9-yl)triphenylamine, TDATA 4,4',4"-tris(N,N-diphenyl-amino)triphenylamine) and polyvinyl carbazole or its monomer.

Herein, it should be understood that, the hole transporting capability prevailing over the electron transporting capability may be defined as the charge transporting capability when the hole mobility is larger than the electron mobility, and may be measured by a conventional method such as a time-of-flight method; it is the same to the electron transporting capability prevailing over the hole transporting capability.

Figure 3:
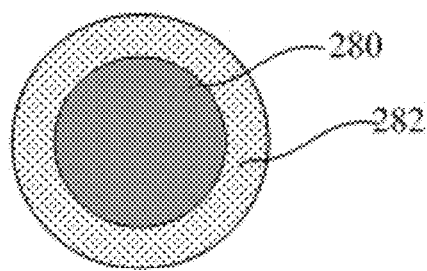
FIG. 3 is a schematic view of a structure of a color conversion unit in the organic light-emitting diode shown in FIG. 2B.

In particular, the method for modifying the surface of the color conversion unit in the present embodiment includes:

As shown in FIG. 3, a layer of organic material is coated on the surface of the quantum dot 280 which is usable as mentioned above, to form the organic material layer 282, and the transporting characteristics of the organic material layer 282 are close to those of the carriers (mainly the hole carriers) of the matrix material for forming the hole transporting layer 24', for example, a layer of mercaptoethanol (ME) is coated on the surface of the ZnS quantum dot to form the color conversion unit 28, which can effectively improve the carrier transporting characteristics, improving the luminous efficiency and the light stability.

Figure 4:
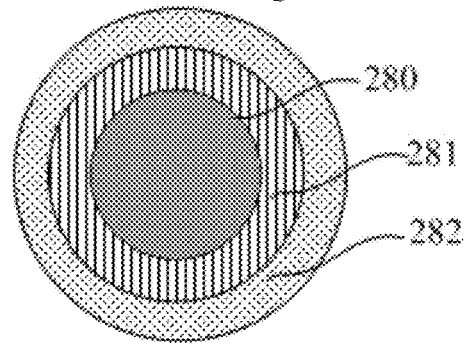
FIG. 4 is a schematic view of a structure of a color conversion unit in the organic light-emitting diode shown in FIG. 2B.

Research shows that, the quantum dot has certain water solubility, and can be coupled to the organic molecules by the active groups on its surface. As shown in FIG. 4, after an inorganic material layer 281 is coated on the surface of the quantum dot 280, an organic material layer 282 is further modified on its surface, and thus the color conversion unit can be combined with organic macromolecules by amide bonds. Herein, as an alternative, CdSe can be selected as the quantum dot 280, ZnS is selected as the organic material, and thioglycolic acid can be selected as the organic material. Herein, surfactants or polymers (styrene, acrylic acid, methyl methacrylate MMA, twelve sodium alkyl sulfonate SDS, azo-bis-isobutyronitrile AIBN, thioglycolic acid, mercapto ethanol ME, divinylbenzene DVB, etc.) usually can also be used as the organic material layer 282 to modify the surface of the quantum dot.

In the present embodiment, in the color conversion unit formed by the above two ways, in other words, in the color conversion unit by modifying the quantum dot, since the formed surface has carrier transporting characteristics close to those in the hole transporting layer, the carrier transporting characteristics can be improved, and the luminous efficiency and the light stability can be increased. A specific reason is as follows: in general, the hole transporting layer is mainly made of an organic material, and the surface of the quantum dot is modified so that the color conversion unit can be effectively combined with the organic material, so that the carriers can smoothly transport inside the organic light-emitting diode 201, and the carrier mobility will be accordingly increased.

In addition, the driving substrate 10 acts as a layer for the organic light-emitting diode 201 to adhere to, and has a good light transmissive performance for the visible light region, has certain ability of preventing water vapor and oxygen from permeating, and has smooth surface. The driving substrate 10 may be a glass or flexible substrate, or a TFT backplane, wherein the flexible substrate may be made of one of polyester and polyimide compound, or be made of a thin metal sheet, and a corresponding light transmissive region of the display panel is transparent.

The anode, functioning as the connection layer of the organic light-emitting diode 201 which is intended to be connected to a positive voltage, has excellent conductive performance and relatively high work function values. The anode is usually made of an inorganic metal oxide (for example: indium tin oxide ITO, Zinc Oxide ZnO with high work function values of 4.5 eV-5.3 eV, and being stable in property and transparent) or organic conductive polymers (such as PEDOT (poly (3,4-ethylenedioxythiophene)): PSS (poly(4-styrenesulfonate)), PANI (polyaniline)) etc.) or metal materials of high work function values (for example: gold, copper, silver, platinum etc).

The cathode, functioning as the connection layer of the organic light-emitting diode 201 which is intended to be connected to a negative voltage, has excellent conductive performance and lower work function values. In order to increase the luminous efficiency of the organic light-emitting diode, the cathode is usually made of a metal material of a low work function value, such as Li, Mg, Ca, Sr, Al, In, or made of a metal material such as Cu, Au, Ag, or alloy thereof.

In FIG. 2A, the first electrode 21 generally acts as the cathode, may be a metal layer, and according to the direction of light emitted from the organic light-emitting diode, the metal layer may be semi-transparent or opaque; the second electrode generally acts as the anode, and is made of a transparent material ITO, that is, the cathode is located above the driving substrate 10, and the anode is located above the cathode. In the present embodiment, FIG. 2A takes a top-emission type organic light-emitting diode as an example, that is, the second electrode 25 is located at the light outgoing side of the organic light-emitting diode 201, because light emitted from the light-emitting layer leaves from the side of the second electrode 25, the second electrode 25 is generally made of a transparent conductive material which can transmit the light, such as a transparent ITO thin film, and the first electrode 21 is opaque metal capable of reflecting light.

Of course, in variants of some other structures, the first electrode 21 may act as the anode, and the second electrode 25 may act as the cathode, which is not limited in the invention. At the same time, it is easy to infer that, the configuration of materials for the first electrode 21 and the second electrode 25 in a bottom-emission type organic light-emitting diode 201 is opposite to those in FIG. 2A.

In the present embodiment, the sub-pixel region is also provided with a color filter 27, which is arranged at the light outgoing side of the organic light-emitting diode 201, and the color filter 27 causes light emitted from the organic light-emitting diode 201 to be selectively transmitted through the display panel.

The color filter 27 includes a red light filter, a green light filter and a blue light filter, and light emitted from the light-emitting layer 23 or light converted by the color conversion unit 28 in the organic light-emitting diode 201 transmits through the color matched red light filter, green light filter or blue light filter to exit the display panel. In the present embodiment, the color conversion units 28 are distributed in the hole transporting layer 24' so that the color conversion units 28 are distributed throughout the full color pixel regions, which include a plurality sub-pixel regions of different colors.

Figure 2B:
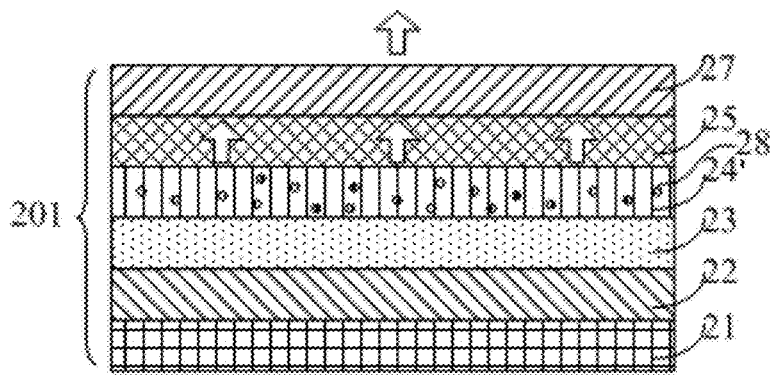
FIG. 2B is a schematic view of a structure of an organic light-emitting diode according to Embodiment 1 of the invention.

In the present embodiment, FIG. 2B only takes a sub-pixel region as an example, for example a sub-pixel region emitting green light as an example, a sub-pixel region emitting red light and a sub-pixel region emitting blue light have the similar structure. The green sub-pixel region, the red sub-pixel region and the blue sub-pixel region form a pixel region; of course, a pixel region may be composed of sub-pixel regions of more than three colors, which is not limited herein. Compared to the pixel region formed by the green sub-pixel region, the red sub-pixel region and the blue sub-pixel region, a pixel region composed of sub-pixel regions of more than three colors can increase the color gamut of the display panel, improve the transmittance of the display panel, enhance the color saturation degree, and improve the display quality of the display panel.

By adjusting the input voltage of the electronic control element 11 in each of the R, G, B sub-pixel regions (that is, adjusting current), intensity of light emitted from each organic light-emitting diode 201 can be individually controlled, thus the R, G, B light effect can be individually adjusted.

In order to simplify the manufacturing procedure, in the case that a small molecule OLED is used, when the organic light-emitting diode 201 of the present embodiment is formed, the electron transporting layer, the light-emitting layer and the hole transporting layer including the color conversion units of the organic light-emitting diode are respectively formed by thermal evaporation processes at a plurality of sub-pixel regions without performing a patterning process, in which it is not required to use different processes to form the hole transporting layer at regions of different colors, which is doped with the color conversion units. In the thermal evaporation process for the hole transporting layer, the material of the color conversion units 28 prepared in advance and the intrinsic material for forming the hole transporting layer are placed in the vacuum reaction chamber, to be formed above the light-emitting layer 23 by the thermal evaporation process, as shown in FIG. 2B, that is, the hole transporting layer at a plurality of sub-pixel regions corresponding to the red sub-pixel regions, a plurality of sub-pixel regions corresponding to the green sub-pixel regions and a plurality of sub-pixel regions corresponding to the blue sub-pixel regions can be formed by using a single thermal evaporation process, and it is not required to form pixel regions of three colors by three patterning processes, thereby effectively simplifying the manufacturing procedure of the display panel, and saving masks. In the case that a large molecule OLED is used, the color conversion units 28 prepared in advance are evenly distributed in the solution for forming the hole transporting layer, and then a film is applied above the light-emitting layer 23 shown in FIG. 2B using a spin coating process.

It should be understood that, the hole transporting layer containing the color conversion units may be formed by the thermal evaporation process (for small molecule OLED), or by the spin coating process (for large molecular OLED), in addition to this, corresponding film layers of the OLED may be formed by inkjet printing.

In the present embodiment, taking the blue OLED as an example, the luminous principle of the display panel is as follows. When a voltage is applied between the anode and the cathode, and driven by the voltage, the hole injected from the anode enters into the light-emitting layer 23 through the hole transporting layer 24', and the electron injected from the cathode enters into the light-emitting layer 23 through the electron transporting layer 22, and the hole and the electron entering into the light-emitting layer 23 recombine at the recombination region to form excitons, the radiative transition of which will emit light, so that a light-emitting phenomenon occurs, i.e., emitting blue light; since the color conversion units 28 are doped into the hole transporting layer 24', the blue light emitted from the light-emitting layer 23 irradiates on the red quantum dots and the green quantum dots in the hole transporting layer 24', which will be stimulated to emit red light and green light, respectively. The red light and the green light emitted after the quantum dots are stimulated are mixed with the blue light which is not affected by the color conversion units to pass through the color filter 27 to realize the full color display.

Of course, the organic light-emitting diode may also include other layers, such as one or more of an electron blocking layer, a hole and exciton blocking layer, an electron injection layer and a hole injection layer.

Embodiment 2

Figure 5:
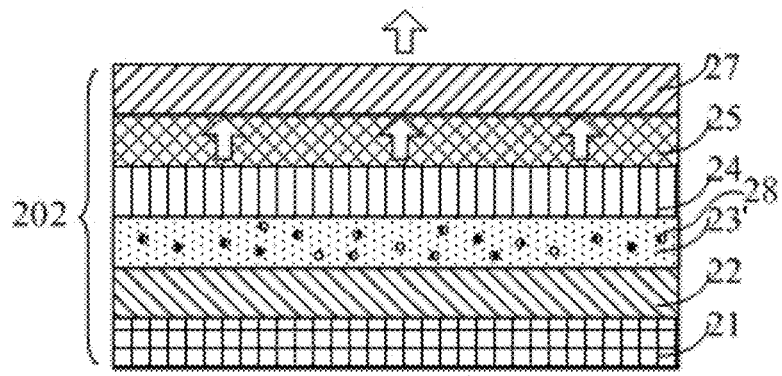
FIG. 5 is a schematic view of a structure of an organic light-emitting diode according to Embodiment 2 of the invention.

The present embodiment provides a display panel, as shown in FIG. 5, and the display panel includes a driving substrate (not shown in FIG. 5) and an organic light-emitting diode 202 provided on the driving substrate. The organic light-emitting diode 202 includes a first electrode 21 and a second electrode 25, and further includes an electron transporting layer 22, a light-emitting layer 23' and a hole transporting layer 24 provided between the first electrode 21 and the second electrode 25. In the present embodiment, a plurality of color conversion units 28 are uniformly distributed in the light-emitting layer 23', and the light-emitting layer 23' is stimulated to emit blue light (monochromic light), and the blue light will irradiate the color conversion units 28 to emit green light or red light, which will pass through the color filter 27 to realize the full color display.

Generally, the light-emitting layer is made of an organic material, which has characteristic of having strong fluorescence in solid state, good carrier transporting performance, good thermal stability and chemical stability, and high quantum efficiency, and which can also be evaporated under vacuum. In the present embodiment, the light-emitting layer 23' is made of a matrix material doped with a luminous material. The matrix material of the light-emitting layer 23' may be a material of which the electron transporting capability prevails over the hole transporting capability, such as metal complexes, carbazole derivatives, imidazole derivatives, o-phenanthroline derivatives or anthracene derivatives, or may be a material of which the hole transporting capability is higher than the electron transporting capability, such as aromatic diamine compounds, triphenylamine compound, aromatic triamine compounds, biphenyl diamine derivatives, triarylamine polymers; as for the luminous material, the luminous material for the small molecule OLED generally uses Alq as the green luminous material, and uses BAlq (bis(2-methyl-8-hydroxyquinoline-N1,O8)-(1,1'-diphenyl-4-hydroxy)Aluminum) and DPVBi (4,4'-bis(2,2-benzoxazolyl)-1,1'-diphenyl) as the blue luminous material, and the luminous material of the high molecule OLED generally uses PPV and its derivatives.

Similarly, in order to ensure the smooth carrier transport, the surfaces of the doped particles may be modified by referring to Embodiment 1, that is, the surface of the quantum dot is modified with an organic material layer made of an organic material, or the surface of the quantum dot is modified with a laminated structure of an organic material layer and an inorganic material layer made of an organic material and an inorganic material, respectively, thus improving the carrier transport performance, increasing the luminous efficiency and light stability.

In the present embodiment, the blue light emitted from the light-emitting layer 23' of the organic light-emitting diode 202 irradiates on the red quantum dot and the green quantum dot in the light-emitting layer 23', which are stimulated to emit red light and green light, respectively, and the red light and the green light emitted after the quantum dots are stimulated are mixed with the blue light which is not affected by the color conversion units to pass through the color filter 27 to realize the full color display.

Of course, the organic light-emitting diode may also include other layers, such as one or more of an electron blocking layer, a hole and exciton blocking layer, an electron injection layer and a hole injection layer. Alternatively, the organic light-emitting diode may only include the light-emitting layer.

In the present embodiment, the configuration of other layers of the display panel and the corresponding manufacturing method can refer to Embodiment 1, and will not be repeated herein.

Embodiment 3

Figure 6:
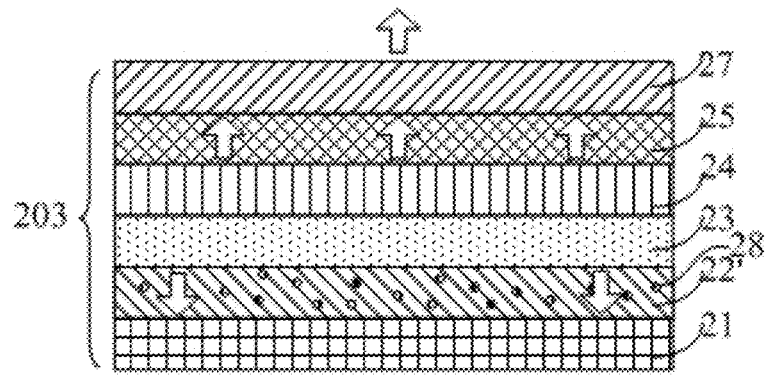
FIG. 6 is a schematic view of a structure of an organic light-emitting diode according to Embodiment 3 of the invention.

The present embodiment provides a display panel, as shown in FIG. 6, and the display panel includes a driving substrate (not shown in FIG. 6) and an organic light-emitting diode 203 provided on the driving substrate. The organic light-emitting diode 203 includes a first electrode 21 and a second electrode 25, and further includes an electron transporting layer 22', a light-emitting layer 23 and a hole transporting layer 24 provided between the first electrode 21 and the second electrode 25. In the present embodiment, a plurality of color conversion units 28 are uniformly distributed in the electron transporting layer 22'.

Generally, the electron transporting layer and the hole transporting layer of the organic light-emitting diode are made of different organic materials. The material most frequently used to make the electron transporting layer usually has high stability of membrane preparation, thermal stability and good electron transport characteristics. In this embodiment, the electronic transporting layer 2T may be made of a material of which the electron transporting capability is higher than the hole transporting capability, such as metal complexes, carbazole derivatives, imidazole derivatives, o-phenanthroline derivatives or anthracene derivatives, and is generally made of a fluorescent dye compound, such as Alq (8-hydroxyquinoline aluminum), Znq(8-hydroxyquinoline zinc), Gaq(8-hydroxyquinoline gallium), Bebq (bis(10-hydroxybenzo[H]quinolinato) beryllium), BAlq(bis(2-methyl-8-hydroxyquinoline-N1,O8 (1,1'-biphenyl-4-hydroxyl)aluminum), DPVBi (4,4'-Bis(2,2-diphenylvinyl)-1,1'-biphenyl), ZnSPB, PBD (2-(4-Diphenyl)-5-(4-Biphenylyl)-1,3,4-oxadiazole), OXD (1,3,4-oxadiazole derivatives), BBOT (2-benzoxazolyl thiophene) etc.

Similarly, in order to ensure the smooth carrier transport, the surfaces of the doped particles may be modified by referring to Embodiment 1, that is, the surface of the quantum dot is modified with an organic material layer made of an organic material, or the surface of the quantum dot is modified with a laminated structure of an organic material layer and an inorganic material layer made of an organic material and an inorganic material, respectively, thus improving the carrier transport performance, increasing the luminous efficiency and light stability.

In the present embodiment, the electron transporting layer 2T is located between the light-emitting layer 23 and the first electrode 21, and the first electrode 21 is made of opaque metal to reflect the light, which is emitted from the light-emitting layer 23 and converted by the color conversion units 28 in the electron transporting layer 22', so as to increase the light utilization efficiency.

In the present embodiment, the blue light emitted from the light-emitting layer 23 of the organic light-emitting diode 203 irradiates on the red quantum dots and the green quantum dots in the electron transporting layer 22', which will be stimulated to emit red light and green light, respectively. The red light and the green light emitted after the quantum dots are stimulated, as well as the blue light which is not affected by the color conversion units are reflected upwards by the first electrode 21 of the opaque metal to pass through the color filter 27 to realize the full color display.

Of course, the organic light-emitting diode can also include other layers, such as one or more of an electron blocking layer, a hole and exciton blocking layer, an electron injection layer and a hole injection layer.

In the present embodiment, the configuration of other layers of the display panel and the corresponding manufacturing method can refer to Embodiment 1, and will not be repeated herein.

In the Embodiment 1 to Embodiment 3, the electron transporting layer 22 and the electron transporting layer 22' are made of the same material, except that the electron transporting layer 22' is doped with the color conversion units; the light-emitting layer 23 and the light-emitting layer 23' are made of the same material, except that the light-emitting layer 23' is doped with the color conversion units; the hole transporting layer 24 and the hole transporting layer 24' are made of the same material, except that the hole transporting layer 24' is doped with the color conversion units.

Performance test is performed on the display panel according to any one of Embodiment 1 to Embodiment 3. The display panel has a configuration as illustrated in FIG. 2A, and the only difference is in that the color conversion units 28 are provided in the hole transporting layer 24' (Embodiment 1), the light-emitting layer 23' (Embodiment 2), and the electron transporting layer 22' (Embodiment 3), respectively. The existing display panel as a comparison example is configured as shown in FIG. 1. The results show that, the display panel according to any one of Embodiment 1 to Embodiment 3 has improved color purity and carrier mobility with respect to the existing display panel.

Embodiment 4

A display device includes the display panel according to any one of Embodiment 1 to Embodiment 3.

The display device may be any product or component having the display function such as electronic paper, a mobile phone, a tablet computer, a TV, a monitor, a notebook computer, a digital photo frame, and a navigator.

Herein, it should be understood that, the configuration, that the color conversion units are provided in any one of the electron transporting layer, the light-emitting layer and the hole transporting layer, of the organic light-emitting diode in the Embodiment 1 to Embodiment 3, is applicable to the top-emission type organic light-emitting diode, and also applicable to the bottom-emission type organic light-emitting diode.

In the invention, with the configuration that the color conversion units are directly doped into any one of the electron transporting layer, the light-emitting layer and the hole transporting layer of the organic light-emitting diode, the structure of the display panel and the corresponding manufacturing procedure are simplified; at the same time, the surfaces of the quantum dots are modified to form the color conversion units, which can effectively increase the carrier mobility; moreover, the luminous efficiency of the quantum dot is high and the spectrum of the emitted light is narrow, improving the color purity of the corresponding sub-pixel, and further improving the color purity of the combined pixel region, and compared to other color conversion material, the quantum dot has better color purity, and accordingly the color purity of the panel display is increased.

It should be understood that, the above embodiments are just exemplary embodiments for illustrating the principle of the present invention. However, the present invention is not limited thereto. Various variations and improvements can be made by a person skilled in the art without departing from the spirit and essence of the present invention, and these variations and improvements should also be considered to be within the protection scope of the present invention.

The invention claimed is:

1. A display panel, including a driving substrate and an organic light-emitting diode provided on the driving substrate, wherein
   the organic light-emitting diode includes a first electrode and a second electrode, and further includes an electron transporting layer, a light-emitting layer and a hole transporting layer provided between the first electrode and the second electrode, wherein
   a plurality of color conversion units are uniformly distributed in one of the electron transporting layer, the light-emitting layer and the hole transporting layer, wherein
   the color conversion units each include a core and a shell encasing the core, the core includes a quantum dot and the shell includes a layered structure made of an organic material, and wherein the layered structure is configured for improving the carrier transporting characteristics.

2. A display panel, including a driving substrate and an organic light-emitting diode provided on the driving substrate, wherein
   the organic light-emitting diode includes a first electrode and a second electrode, and further includes an electron transporting layer, a light-emitting layer and a hole transporting layer provided between the first electrode and the second electrode, wherein
   a plurality of color conversion units are uniformly distributed in any one of the electron transporting layer, the light-emitting layer and the hole transporting layer, wherein
   the color conversion units each include a core and a shell encasing the core, the core includes a quantum dot, and the shell includes a laminated structure made of an organic material and an inorganic material,
   and wherein the laminated structure is configured for improving the carrier transporting characteristics.

3. The display panel according to claim 1, wherein
   the quantum dot includes CdS, CdSe, CdTe, ZnO, ZnS, ZnSe, ZnTe, GaAs, GaP, GaSb, HgS, HgSe, HgTe, InAs, InP, InSb, AlAs, AlP or ASb; and wherein
   the organic material includes mercaptoethanol.

4. The display panel according to claim 2, wherein
   the quantum dot includes CdS, CdSe, CdTe, ZnO, ZnS, ZnSe, ZnTe, GaAs, GaP, GaSb, HgS, HgSe, HgTe, InAs, InP, InSb, AlAs, AlP or AlSb; and wherein
   the organic material includes mercaptoethanol, and the inorganic material includes CdS or ZnS.

5. The display panel of claim 3, wherein the quantum dot includes a red quantum dot, a green quantum dot or a blue quantum dot, the red quantum dot as the core has a particle size in the range of 5.0 to 5.5 nm, the green quantum dot as the core has a particle size in the range of 3.0 to 3.5 nm, and the blue quantum dot as the core has a particle size in the range of 2.0 to 2.5 nm.

6. The display panel of claim 2, wherein
   the quantum dot includes a red quantum dot, a green quantum dot or a blue quantum dot, the red quantum dot as the core has a particle size in the range of 5.0 to 5.5 nm, the green quantum dot as the core has a particle size in the range of 3.0 to 3.5 nm, and the blue quantum dot as the core has a particle size in the range of 2.0 to 2.5 nm.

7. The display panel according to claim 1, wherein
the electron transporting layer is made of any one of the following materials, of which the electron transporting capability prevails over the hole transporting capability: metal complexes, carbazole derivatives, imidazole derivatives, o-phenanthroline derivatives or anthracene derivatives; the light-emitting layer is made of a matrix material doped with a luminous material; and
the hole transporting layer is made of any one of the following materials, of which the hole transporting capability prevails over the electron transporting capability: aromatic diamine compounds, triphenylamine compound, aromatic triamine compounds, biphenyl diamine derivatives, or triarylamine polymers.

8. The display panel according to claim 7, wherein the matrix material of the light-emitting layer is any one of the following materials, which has the electron transporting capability: metal complexes, carbazole derivatives, imidazole derivatives, o-phenanthroline derivatives or anthracene derivatives, or the matrix material of the light-emitting layer is any one of the following materials, which has the hole transporting capability: aromatic diamine compounds, triphenylamine compound, aromatic triamine compounds, biphenyl diamine derivatives, or triarylamine polymers; and the luminous material is Alq, BAlq, or DPVBi, or PPV or its derivatives.

9. The display panel according to claim 3, wherein the driving substrate is divided into a plurality of sub-pixel regions, each sub-pixel region is provided with the organic light-emitting diode therein, the sub-pixel region is further provided with an electronic control element therein, which is electrically connected to the first electrode or the second electrode of the organic light-emitting diode, and is used for controlling whether the organic light-emitting diode emits light or not.

10. The display panel according to claim 1, wherein the driving substrate is divided into a plurality of sub-pixel regions, each sub-pixel region is provided with the organic light-emitting diode therein, the sub-pixel region is further provided with an electronic control element therein, which is electrically connected to the first electrode or the second electrode of the organic light-emitting diode, and is used for controlling whether the organic light-emitting diode emits light or not.

11. The display panel according to claim 2, wherein the driving substrate is divided into a plurality of sub-pixel regions, each sub-pixel region is provided with the organic light-emitting diode therein, the sub-pixel region is further provided with an electronic control element therein, which is electrically connected to the first electrode or the second electrode of the organic light-emitting diode, and is used for controlling whether the organic light-emitting diode emits light or not.

12. The display panel according to claim 3, wherein the driving substrate is divided into a plurality of sub-pixel regions, the sub-pixel region is further provided with a color filter, the color filter is arranged at a light outgoing side of the organic light-emitting diode, and the color filter causes the light emitted from the organic light-emitting diode to be selectively transmitted through the display panel.

13. The display panel according to claim 1, wherein the driving substrate is divided into a plurality of sub-pixel regions, the sub-pixel region is further provided with a color filter, the color filter is arranged at a light outgoing side of the organic light-emitting diode, and the color filter causes the light emitted from the organic light-emitting diode to be selectively transmitted through the display panel.

14. The display panel according to claim 2, wherein the driving substrate is divided into a plurality of sub-pixel regions, the sub-pixel region is further provided with a color filter, the color filter is arranged at a light outgoing side of the organic light-emitting diode, and the color filter causes the light emitted from the organic light-emitting diode to be selectively transmitted through the display panel.

15. The display panel according to claim 1, wherein the electron transporting layer, the light-emitting layer and the hole transporting layer of the organic light-emitting diode are formed by evaporation, spin coating or ink jet printing.

16. The display panel according to claim 3, wherein the color filter includes a red color filter, a green color filter or a blue color filter, and light emitted from the light-emitting layer of the organic light-emitting diode or light converted by the color conversion units is transmitted through the display panel via one of the red color filter, the green color filter and the blue color filter, which is matched with the light in color.

17. The display panel according to claim 1, wherein the color filter includes a red color filter, a green color filter or a blue color filter, and light emitted from the light-emitting layer of the organic light-emitting diode or light converted by the color conversion units is transmitted through the display panel via one of the red color filter, the green color filter and the blue color filter, which is matched with the light in color.

18. The display panel according to claim 2, wherein the color filter includes a red color filter, a green color filter or a blue color filter, and light emitted from the light-emitting layer of the organic light-emitting diode or light converted by the color conversion units is transmitted through the display panel via one of the red color filter, the green color filter and the blue color filter, which is matched with the light in color.

19. A display device, including the display panel according to claim 1.

20. The display panel according to claim 2, wherein the electron transporting layer is made of any one of the following materials, of which the electron transporting capability prevails over the hole transporting capability: metal complexes, carbazole derivatives, imidazole derivatives, o-phenanthroline derivatives or anthracene derivatives; the light-emitting layer is made of a matrix material doped with a luminous material; and the hole transporting layer is made of any one of the following materials, of which the hole transporting capability prevails over the electron transporting capability: aromatic diamine compounds, triphenylamine compound, aromatic triamine compounds, biphenyl diamine derivatives, or triarylamine polymers.

21. The display panel according to claim 20, wherein the matrix material of the light-emitting layer is any one of the following materials, which has the electron transporting capability: metal complexes, carbazole derivatives, imidazole derivatives, o-phenanthroline derivatives or anthracene derivatives, or the matrix material of the light-emitting layer is any one of the following materials, which has the hole transporting capability: aromatic diamine compounds, triphenylamine compound, aromatic triamine compounds, biphenyl diamine derivatives, or triarylamine polymers; and the luminous material is Alq, BAlq, or DPVBi, or PPV or its derivatives.

22. The display panel according to claim 2, wherein the driving substrate is divided into a plurality of sub-pixel regions, each sub-pixel region is provided with the organic light-emitting diode therein, the sub-pixel region is further provided with an electronic control element therein, which is electrically connected to the first electrode or the second electrode of the organic light-emitting diode, and is used for controlling whether the organic light-emitting diode emits light or not.

23. The display panel according to claim 2, wherein the driving substrate is divided into a plurality of sub-pixel regions, the sub-pixel region is further provided with a color filter, the color filter is arranged at a light outgoing side of the organic light-emitting diode, and the color filter causes the light emitted from the organic light-emitting diode to be selectively transmitted through the display panel.

24. The display panel according to claim 2, wherein the electron transporting layer, the light-emitting layer and the hole transporting layer of the organic light-emitting diode are formed by evaporation, spin coating or ink jet printing.

25. The display panel according to claim 2, wherein the color filter includes a red color filter, a green color filter or a blue color filter, and light emitted from the light-emitting layer of the organic light-emitting diode or light converted by the color conversion units is transmitted through the display panel via one of the red color filter, the green color filter and the blue color filter, which is matched with the light in color.

26. A display device, including the display panel according to claim 2.

\* \* \* \* \*